United States Patent
Novak et al.

(10) Patent No.: US 6,753,534 B2
(45) Date of Patent: Jun. 22, 2004

(54) POSITIONING STAGE WITH STATIONARY AND MOVABLE MAGNET TRACKS

(75) Inventors: W. Thomas Novak, Hillsborough, CA (US); Michael Kovalerchik, Castro Valley, CA (US)

(73) Assignee: Nikon Corporation, Tokyo (JP)

( * ) Notice: Subject to any disclaimer, the term of this patent is extended or adjusted under 35 U.S.C. 154(b) by 302 days.

(21) Appl. No.: 09/796,641

(22) Filed: Mar. 2, 2001

(65) Prior Publication Data

US 2002/0074516 A1 Jun. 20, 2002

Related U.S. Application Data

(63) Continuation-in-part of application No. 09/731,934, filed on Dec. 8, 2000.

(51) Int. Cl.[7] .................................................. G05G 11/00
(52) U.S. Cl. ........................... 250/442.11; 250/440.11; 250/396 R; 250/398; 250/492.3; 250/504 R
(58) Field of Search ................. 290/442.11, 440.11, 290/396 R, 398, 492.3, 504 R, 365

(56) References Cited

U.S. PATENT DOCUMENTS

| | | | |
|---|---|---|---|
| 4,234,175 A | 11/1980 | Sato et al. | |
| 4,417,770 A | 11/1983 | Tucker | |
| 4,648,723 A | 3/1987 | Sugiyama et al. | |
| 4,916,340 A | 4/1990 | Negishi | |
| 5,013,958 A | 5/1991 | Ohnishi et al. | |
| 5,073,912 A | 12/1991 | Kobayashi et al. | |
| 5,623,853 A | 4/1997 | Novak et al. | |
| 5,669,600 A | 9/1997 | Okada | |
| 5,789,892 A | 8/1998 | Takei | |
| 5,839,324 A | 11/1998 | Hara | |
| 6,002,465 A | * 12/1999 | Korenaga | 355/53 |
| 6,355,994 B1 | * 3/2002 | Andeen et al. | 310/15 |
| 6,583,597 B2 | * 6/2003 | Tanaka et al. | 318/687 |

* cited by examiner

Primary Examiner—Nikita Wells
(74) Attorney, Agent, or Firm—Finnegan, Henderson, Farabow, Garrett & Dunner, L.L.P.

(57) ABSTRACT

A stage positioning system including a stationary frame, a slide movable relative to the frame in a first direction, and a support platform connected to the slide and movable therewith in the first direction. The support platform is movably attached to the slide for movement in a second direction generally orthogonal to the first direction. The system will further include a first linear motor containing a first magnet assembly and a first coil device that engages the first magnet assembly to move the slide in the first direction. A second linear will contain a second magnet assembly and a second coil device that engages the second magnet assembly to move the support platform in the second direction. The stage positioning system is particularly suited for positioning an article in electron beam or EUV light lithography systems.

37 Claims, 7 Drawing Sheets

POSITIONING STAGE WITH STATIONARY AND MOVABLE MAGNET TRACKS

This application is a continuation-in-part of Ser. No. 09/731,934 filed Dec. 8, 2000.

FIELD OF THE INVENTION

The present invention relates to a stage for supporting, moving, and positioning articles, and more specifically, a stage for positioning an article in an electron beam or EUV-light lithography system used for manufacturing semiconductor devices.

BACKGROUND OF THE INVENTION

Many devices such as reticles, semiconductor circuits and liquid crystal displays are fabricated using lithographic equipment, such as an electron beam lithography system. In the fabrication of circuits a article must be repeatedly and precisely positioned under the optics of the lithography system. Such precise positioning is necessary to ensure accurate alignment of the microscopic features being formed in a new layer with other microscopic features in the layers previously formed on the article during the fabrication process for semiconductor circuits.

Complex systems have been developed to precisely position an article, such as a wafer or reticle beneath the lithographic optics. A step and repeat system often uses an x-y positioning system to position the article on a positioning stage beneath the lithographic equipment, expose a portion of the article to a pattern of light or charged particles generated by the lithographic equipment, and reposition the article at another location to again expose the article to the pattern of light or charged particles. Many different types of positioning stages and linear motors which move the positioning stage into the desired position, such as beneath the lithographic equipment, nave been developed in an attempt to provide improved accuracy of article placement.

The articles being worked upon are typically supported and positioned using x-y guides with moving motors. Typically, such guides include separate x and y guide assemblies, with one guide assembly mounted on and movable with respect to the other guide assembly. Often a separate wafer stage is mounted on top of the guide assemblies. As the guides move during the positioning of the wafer, the magnet assemblies of the motors as well as other magnetic permeable materials also move. As a result, the shifting magnetic fields created by the magnet assemblies and other materials may interfere with an electron beam of an electron beam lithography system.

Electron beam lithography is used in the production of high quality patterns. The electron beam passes through magnetic or electrostatic lenses and deflectors capable of focusing the beam into the wafer plane and directing the beam in an x-y direction on the wafer. An election beam projection system typically includes an electron beam source, a deflecting system for deflecting the electron beam in a predetermined pattern, and magnetic projection lenses for focusing the electron beam. The deflected and focused beam is directed to an article which may be, for example, a semiconductor substrate or mask (reticle).

Conventional positioning stages do not typically shield the magnetic fields created by the moving motors or other moving magnetic permeable components from the electron beam lithography system. The magnetic fields may shift the electron beam and cause misalignment of the pattern on the article. Thus, it is desirable to provide a positioning stage which limits the movement of the magnetic fields during positioning of the stage while exposing the article to the electron beam. It is also desirable to shield the magnetic fields from the electron beam to accurately, reliably and timely move and position articles in an electron beam lithography system.

SUMMARY OF THE INVENTION

The present invention overcomes the deficiencies of the prior art by providing a stage positioning system which minimizes interference with an electron beam of an electron beam lithography system by magnetic fields created by the motors of the stage positioning system as well as other magnetic permeable components. The invention also provides a stage positioning system that can be used in an EUV light lithography system.

A stage positioning system of the present invention comprises a stationary frame, a slide movable relative to the frame in a first direction and a support platform connected to the slide and movable therewith in the first direction. The support platform is movably attached to the slide for movement in a second direction generally orthogonal to the first direction. The stage positioning system further includes first and second linear motors.

In the preferred embodiment, the first linear motor includes a first magnet assembly attached to the frame and a first coil device attached to the slide. As current is applied to the first coil device the slide will move in the first direction. The second linear motor includes a second magnet assembly attached to the slide and a second coil device attached to the support platform. As current is applied to the second coil device the support platform will move in the second direction.

The first magnet assembly may include a parallel pair of magnet tracks spaced apart a distance sufficient for receiving the slide therebetween. The first coil device includes coil members extending from opposite ends of the slide to interact with the magnet tracks. The frame may include a rail and the slide may include a slider block movably engagable with the rail. The slider block may contain bearings selected from rotating roller bearings, needle bearings, ball bearings, or gas bearings. The magnet tracks are preferably substantially shielded to prevent interference of the magnetic fields created by the magnet assemblies with an electron beam.

The slide includes a pair of shafts extending generally parallel to a central longitudinal axis of the slide, and the support platform includes a pair of sleeves movably mounted on the shafts. The pair of sleeves may contain gas bearings to support the sleeves about the shafts.

The invention is also of a method of exposing an article in a lithography system, the method including providing a slide movably attached to a stationary frame such that the article can be positioned in a first direction, providing a support platform movably attached to the slide such that the article disposed on the support platform can be positioned in a second direction, providing a first linear motor to move the slide in the first direction and providing a second linear motor to move the support platform in a second direction, positioning the support platform by moving the slide to a selected position in the first direction, and exposing the article to light or an electron beam as the support platform is moved in the second direction. The procedure of moving the slide in the first direction followed by moving the support platform while exposing the article to light or an electron beam, is repeated until the selected exposure operation for the article is completed.

The positioning stage car be used in an electron beam lithography system, or an extreme ultraviolet ("EUV") light lithography system. The lithography systems will comprise an electron beam source or an EUV light source, an optical projection system to project a pattern defined by a mask onto a surface of the article; a deflector system operable to position the electron beam on the article, and the stage positioning system of the invention. When an EUV light source is used, the deflector may not be necessary.

The stage positioning system of both the electron beam and the EUV light lithography systems preferably move the support platform in the first direction while the article is not being exposed to the electron beam or EUV light. The support platform is then moved in the second direction while the article is being exposed to the electron beam or EUV light. This allows the magnet assemblies that move the support platform in the second direction to remain stationary during the exposure of the article. It should be noted that electron beams are sensitive to magnetic fields whereas EUV light sources are not.

BRIEF DESCRIPTION OF THE DRAWINGS

The invention will be better understood by reference to the Detailed Description of the Invention when taken together with the attached drawings, wherein.

Corresponding reference characters indicate corresponding parts throughout the several views of the drawings.

DESCRIPTION OF THE INVENTION

Electron beam lithography is one type of lithography system which uses an electron beam to expose an article. The electron beam is very sensitive to magnetic fields, which may effect the exposure performance of the beam. For this reason the movement of magnetic permeable materials during exposure needs to be minimized. Most if not all of the present positional stages contain magnetic permeable components that move during exposure. Of primary concern is the movement of the magnetic assemblies that position the article to the desired coordinate positions. Other magnetic materials used in the stage such as bearings, support members, or magnetic shielding may also effect exposure performance and should be taken into account when calibrating the system. As these magnetic materials move, the corresponding magnetic fields associated with these materials also move. It is the movement of the magnetic fields which can effect the performance of the electron beam and hence the exposure performance of the system.

The positional stage of the invention is designed to minimize the movement of these magnetic components during the exposure of the article. In the preferred embodiment, the support platform is moved in a first direction while the electron beam is deflected away or shielded from the article. One method of shielding the article from the electron beam is to use a blanking device that turns off the beam. Alternatively, a shutter device could be placed between the beam and the article to block the beam. As the support platform moves with the slide in the first direction the magnetic assembly associated with moving the support platform in a second direction also moves. Other magnetic components associated with the slide also move. However, because the article is not being exposed during this time the movement of the magnetic assembly and the other magnetic components have no effect on exposure performance. The support platform is then moved in the second direction, usually orthogonal to the first, while the article is exposed to the electron beam. Because the support platform contains mostly non-magnetic components, there is little if any movement of magnetic permeable materials during the exposure of the article.

Minimizing the movement of relatively heavy and bulky components during exposure of the article also minimizes the amount of potential vibrations that may occur as the support platform is moved. These vibrations can also have a negative effect on the exposure performance of the system. The positional stage is designed to minimize movement of such components during exposure.

Figure 1:
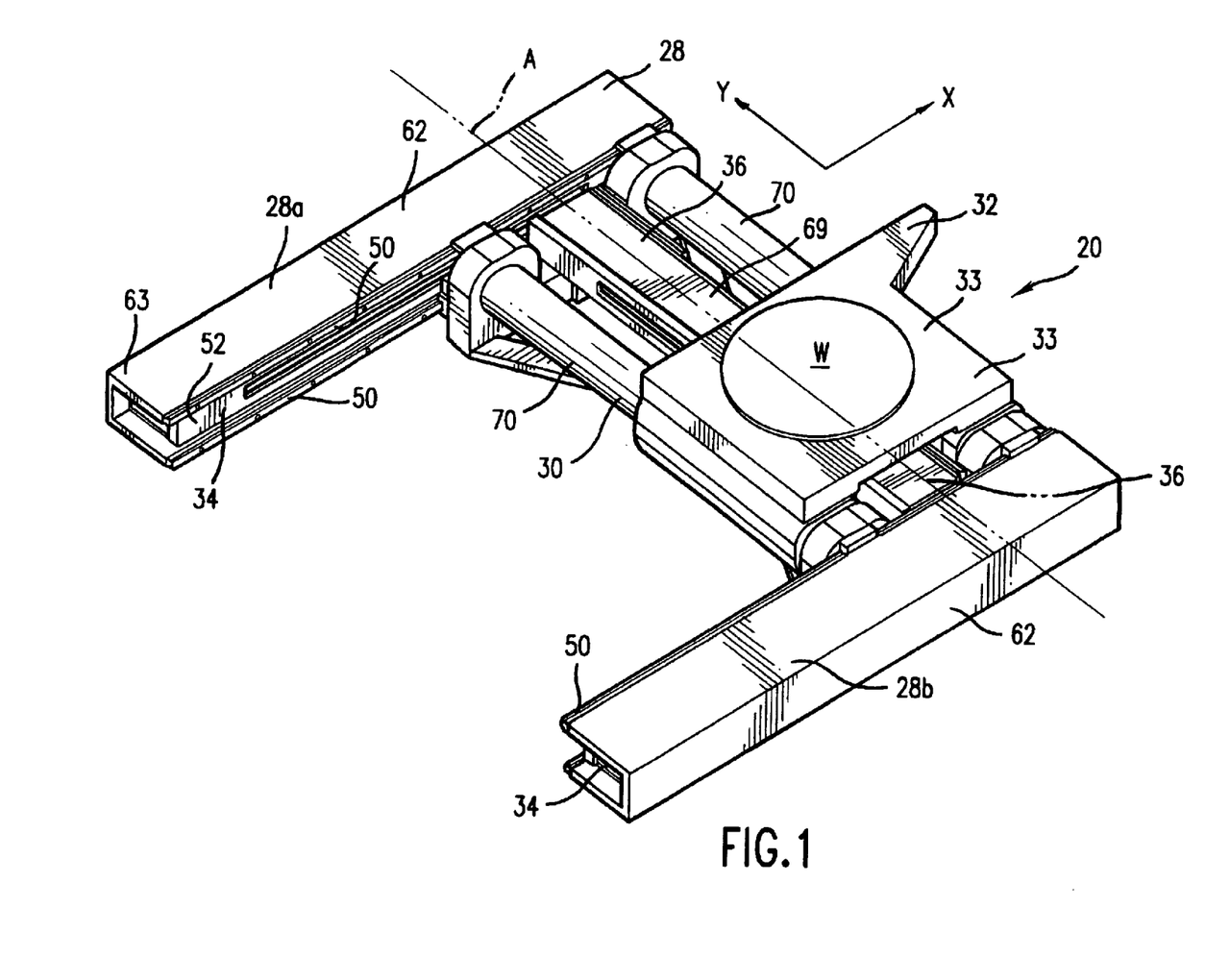
FIG. 1 is a perspective of the stage positioning system of the present invention.

Referring now to the drawings, and first to FIG. 1, a stage positioning system of the present invention is generally indicated at 20. The stage positioning system 20 may be used for positioning a semiconductor wafer W or reticle (not shown) during semiconductor processing, for example. The positioning system 20 is particularly advantageous for applications such as electron beam lithography since motors of the stage positioning system are configured to reduce the effect of magnetic fields of the motors on the electron beam, as further described below. It is to be understood that the stage positioning system 20 of the present invention may be easily adapted for use in other types of systems for article processing such as an EUV lithography system. The general reference to an electron beam lithography system is purely for illustrating an embodiment of an environment in which the concept of the stage positioning system 20 of the present invention may be advantageously adopted. Further, the stage positioning system 20 is described below with reference to a wafer stage, but may also be used as a reticle stage.

Figure 2:
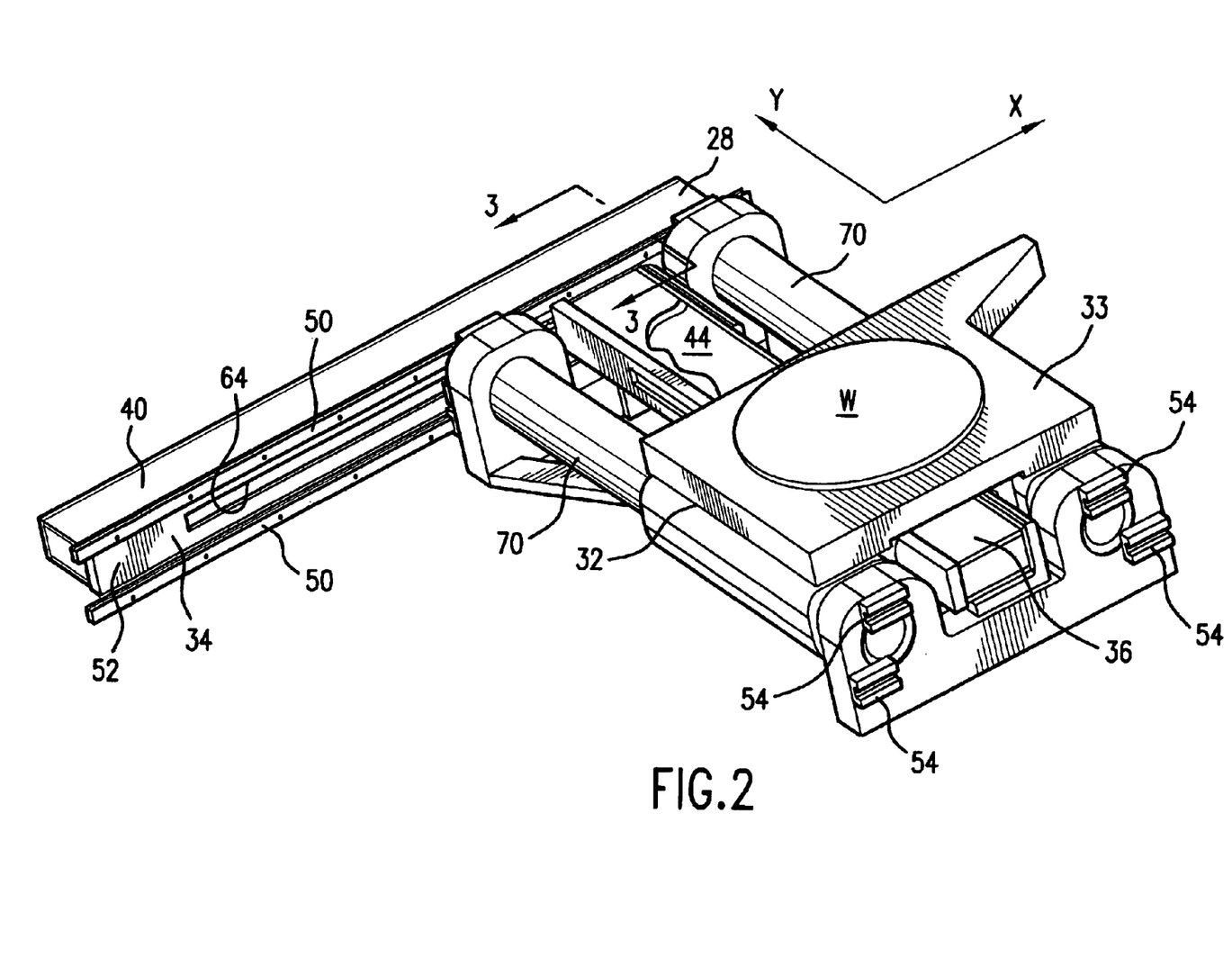
FIG. 2 is a perspective of the positioning system of FIG. 1 with parts removed and broken away to show detail.
Figures 3, 4:
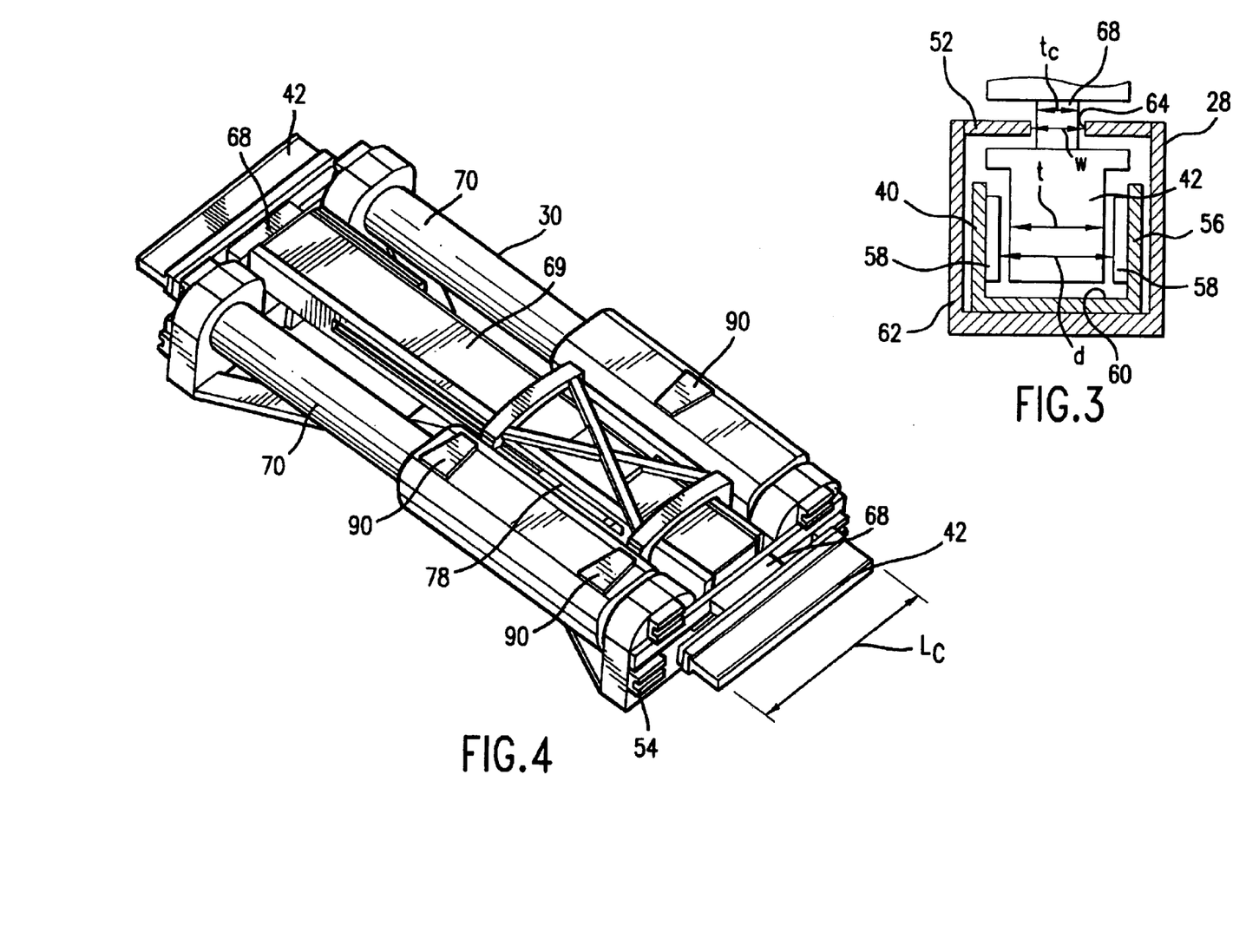
FIG. 3 is a cross-sectional view taken through and including line 3—3 of FIG. 2.
FIG. 4 is a perspective of a slide of the positioning system of FIG. 1.
Figure 6:
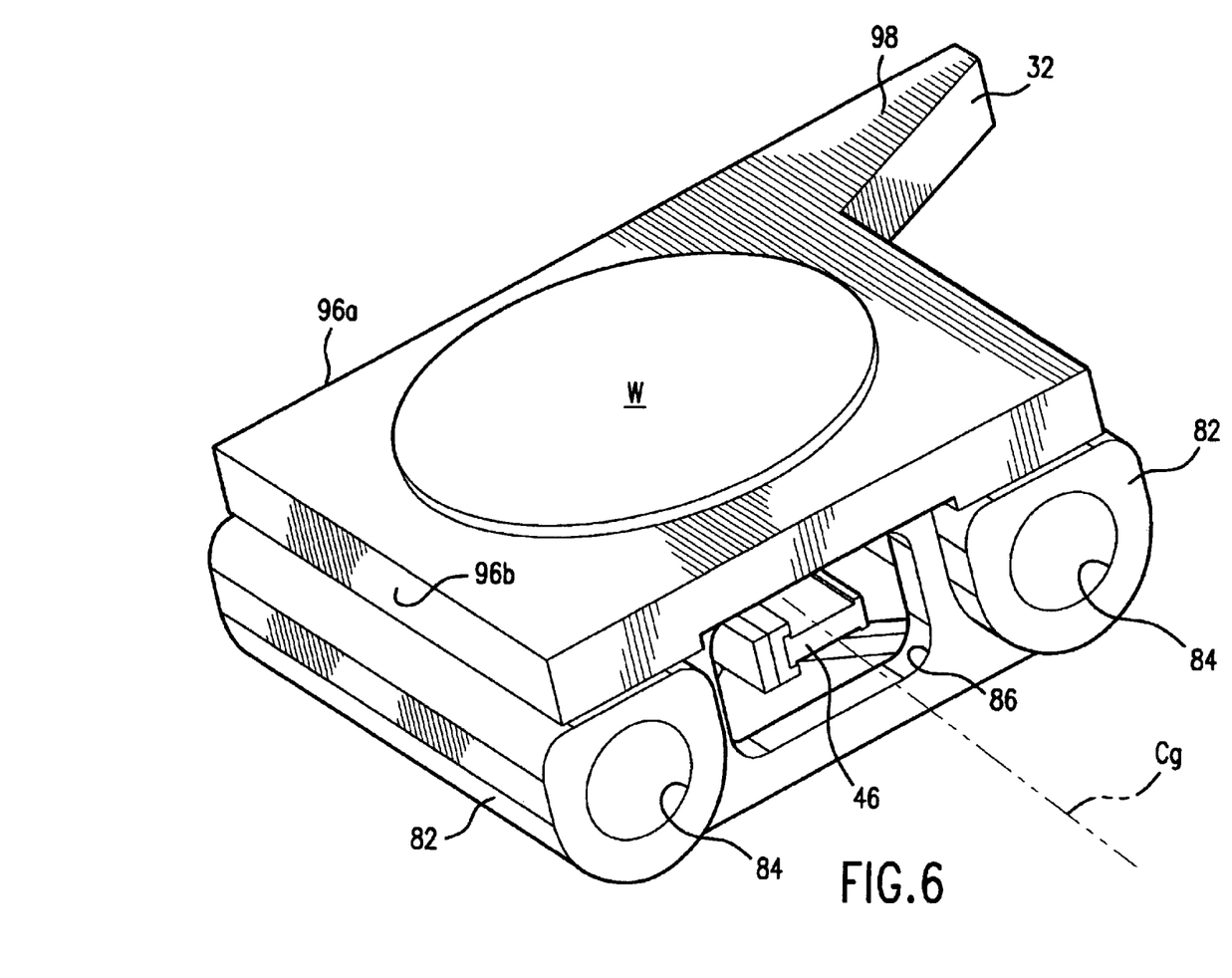
FIG. 6 is a perspective of a support platform assembly of the positioning system of FIG. 1.

The stage positioning system 20 comprises a stationary frame 28, a slide 30 movable relative to the frame in an x (first) direction, and a support platform assembly 32 having a support platform 33 configured for supporting a semiconductor wafer W. The support platform assembly 32 is movably attached to the slide 30 for movement along the slide in an y (second) direction. The positioning stage 20 further includes two x linear motors (first motor) 34 for moving the slide 30 in the x direction and a y linear (second) motor 36 for moving the support platform 33 in the y direction. Each of the x motors 34 include a magnet track 40 and a coil member 42 operable to interact with magnetic fields of the magnetic track to generate a force to move the slide 30 in the x direction (FIGS. 1 and 3). Similarly, the y motor 36 includes a magnet track 44 and coil member 46 operable to interact with magnetic fields of the magnetic track to generate a force to move the support platform 33 in the y direction (FIGS. 2 and 6). The magnet tracks 40 of the x linear motors 34 form a magnet assembly. One or more coil members 42 form a coil device.

It is to be understood that the arrangement and configuration of the magnet assembly and coil device may be different than shown and described herein without departing from the scope of the invention. For example, as shown in FIG. 1, the first magnetic assembly is attached to the frame, and as shown in FIG. 2, the first coil device is attached to each end of the slide. Alternatively, it is possible that the first magnetic assembly can be attached to the slide and the first coil device attached to the frame.

In addition, FIGS. 2 and 4 show the preferred embodiment, with the second magnetic assembly attached to the slide, and the second coil device attached o the support platform. Alternatively, it is possible that the second magnetic coil could be attached to the slide and the second magnetic assembly attached to the support platform. However, this embodiment would result in the second magnetic assembly being moved as the article is exposed.

The positioning stage 20 is preferably arranged so that the support platform 33 moves in the y direction during a scan operation of the lithography system (FIGS. 1 and 2). The x and y magnet tracks 40, 44 remain stationary during movement of the support platform 33 in the y direction. Thus, any shifting magnetic fields associated with the magnet tracks 40, 44 do not interfere with the electron beam during the scan process. When the support platform assembly 32 moves in the x direction the y magnet track 44 also moves. However, the movement of the y magnet track 44 is of little consequence because the lithography system is not scanning at this time. The electron beam is either turned off, shielded from, or directed away from the support platform. Since there is no scanning while the platform moves in the x-direction, the effect of moving the y linear motor has no effect on the patterning of the article.

As is well known by those skilled in the art, a force sufficient to move the coil members 42, 46 is generated between the coil members and the magnet tracks 40, 44 by application of appropriate current to the coil members. By synchronously actuating the x linear motors 34, a force is exerted on the x coil members 42 which are connected to the slide 30 to force the slide to move in the x direction. Similarly, by actuating the y linear motor 36, a force is exerted on the y coil member 46 which is connected to the support platform assembly 32 to thereby position the support platform 33 along the y axis. Art example of a type of linear motor for use in the positioning stage system 20 is described in copending U.S. patent application Ser. No. 09/054,766, by A. Hazelton et al., filed Apr. 3, 1998, the entirety of which is incorporated herein by reference The provision of two generally parallel x linear motors 34 facilitates in reducing or preventing vibration of the support platform 33 as well as reducing or preventing the creation of a moment about the z axis. In particular, the provision of two generally parallel x linear motors 34 facilitates in driving the slide 30 through the center of gravity or through a location near the center of gravity in the y direction.

The frame 28 is formed from two elongated frame members 28a, 28b spaced from one another along the y axis a distance sufficient to permit movement of the slide 30 therebetween (FIGS. 1 and 2). Each frame member 28a, 28b includes a pair of parallel rails 50 extending longitudinally along the frame member (FIG. 2). The rails 50 are disposed on inner walls 52 of the frame members 28a, 28b and positioned along upper and lower edges of the inner walls. The rails 50 are provided as guides for U-shaped slider blocks 54 extending from opposite ends of the slide 30 (FIG. 2). Two pairs of slider blocks 54, one pair for each rail 50, are attached to each end of the slide 30 for sliding engagement with the rails. The slider blocks 54 and rails 30 may be any suitable slider block and rail system, such as those utilizing roller balls. An example of a suitable slider block and rail system is a guide system available from THK America Inc., of Schaumburg, Ill., under product designation SSR LM. It is to be understood that the rail 50 and slider block 54 arrangement may be different than shown herein without departing from the scope of the invention. For example, air bearings or ball bearings may be used rather than roller bearings.

Another advantage of scanning only while the platform is moving in the y-direction is that vibrations caused by the x-bearings 54 along the tracks 50 occurs only when the slide 30 moves in the x-direction. Since the slide 30 does not move in the x-direction during exposure of the article the amount of vibrations caused by the bearings 54 have no effect on exposure performance. As a result, one embodiment may include incorporating less expensive, conventional roller-type bearings to move the slide 30 in the x-direction, and more sophisticated gas bearings to propel the support platform 33 along the slide 30 in the y-direction.

The x magnet tracks 40 of the x linear motors 34 are each disposed within one of the elongated frame members 28a, 28b (FIGS. 1 and 3). Each magnet track 40 comprises a generally U-shaped support member 56 and a magnet array comprising a plurality of magnets 58. The magnet track 40 forms a longitudinal slot 60 for movably receiving the coil member 42 therein. The magnet track 40 has a length preferably greater than a length Lc of the coil member 42 plus the stroke of the x linear motor 34 in the x direction (FIGS. 2 and 4). The magnet track 40 is surrounded by a shield 62 and fixedly connected thereto (FIG. 3). As shown in FIG. 1, the shields 62 form the elongated members 28a, 28b and each comprise a U-shaped member 63 and the inner wall 52. The magnet track 40 is completely shielded by the shield 62 except for a longitudinal slot 64 formed in the inner wall 52 and extending along the length of the magnet track to permit movement of the coil member 42 along the length of the track. The shield 62 is preferably formed from steel or other suitable material to shield the magnetic fields generated by the magnet track 40 and prevent interference by the magnetic fields from the magnet track with the electron beam.

The coil member 42 is a generally planar member having a thickness t slightly less than a distance d between the magnets 58 (FIG. 3). The coil members 42 are attached to opposite ends of the slide 30 by a connecting member 68 extending outwardly from the ends of the slide (FIGS. 3 and 4). The connecting member 68 has a thickness $t_c$ slightly less than a width $L_w$ of the slot 64 of the shield 62.

Figure 5:
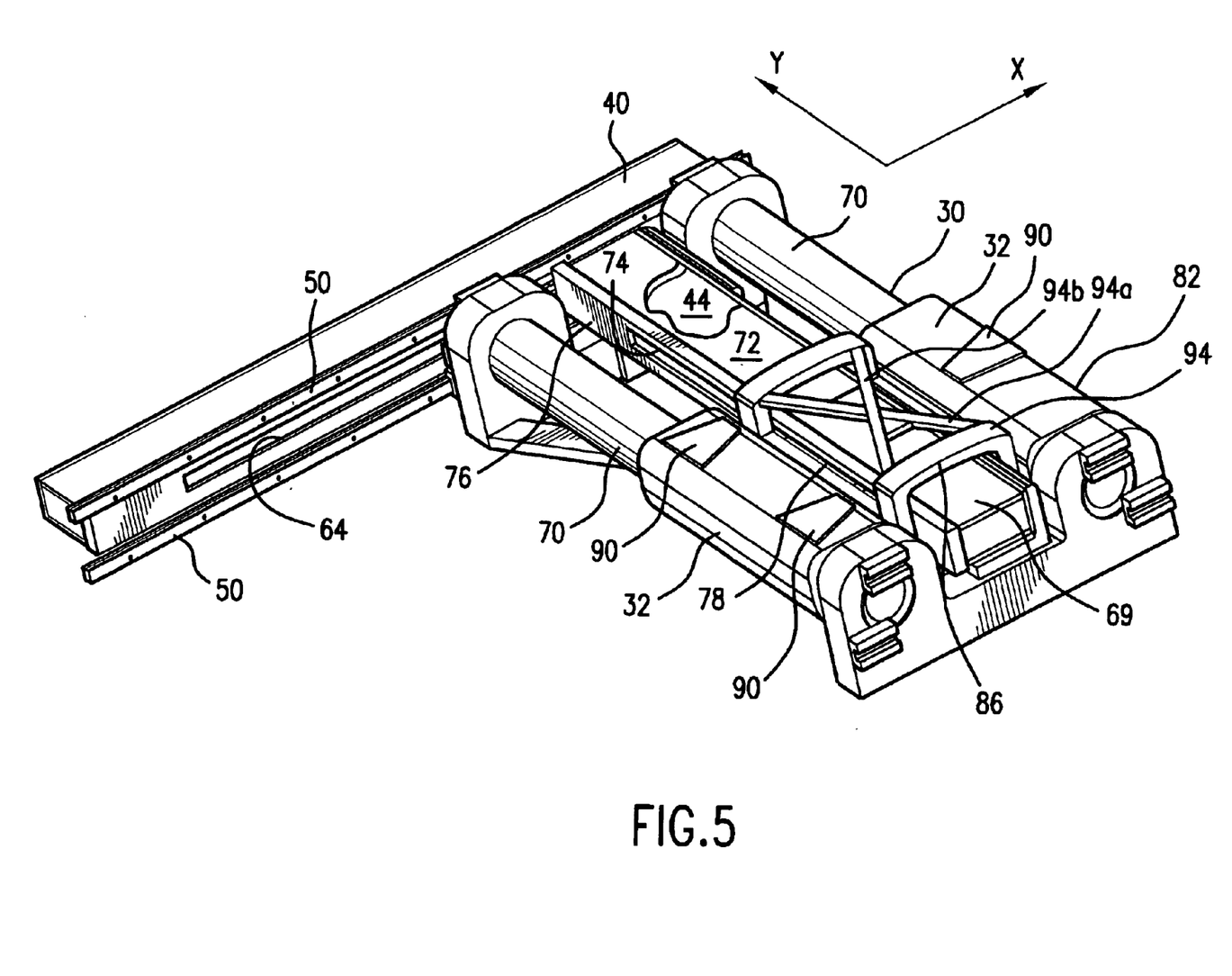
FIG. 5 is a perspective of the slide and a portion of an x linear motor of the positioning system of FIG. 1 with a support platform removed to show further detail.

The slide 30 comprises an elongated member 69 extending along a central longitudinal axis A of the slide and two cylindrical shafts 70 extending generally parallel to the elongated member on opposite sides thereof (FIGS. 1 and 5). The elongated member 69 and shafts 70 are yoked together at each end to form the slide 30. The elongated member 69 is formed from the y magnet track 44 and shield 72 which are similar to the x magnet track 40 and shield 62 described above and shown in FIG. 3. The shield 72 has a longitudinal slot 74 formed in a sidewall 76 thereof for receiving a connecting member 78 which couples the coil member 46 to the support platform assembly 32 (FIGS. 5 and 6). The sidewall 76 is removably attached to the other portion of the shield 72 so that the coil 46 can be positioned within the magnet track 44 during assembly.

The support platform assembly 32 includes two cylindrical sleeves 82 configured for movably receiving the shafts 70. An air bearing (not shown) is positioned within central openings 84 of the sleeves. The air bearing facilitates sliding of the support platform assembly 32 along the shafts 70 in the y direction. Any suitable bearing including mechanical bearings such as roller, needle, or ball bearings, or gas bearings may be used. Preferably, gas bearings support the mass of the support platform 33 by pressurized air, nitrogen, or other suitable gas which provides an air cushion between the inner surface of the sleeves 82 and the outer surface of the shafts 70. The use of the gas bearings minimizes vibrations which can extend to the support platform 33 during the scanning operation. The support platform assembly 32 has a central opening 86 extending longitudinally therethrough generally parallel to the sleeves 82 and sized to fit over the shield 72. The coil member 46 extends longitudinally through a portion of the central opening 86 and is positioned generally along a center of gravity line Cg of the support platform assembly 32. This facilitates in driving the support platform 33 through its center of gravity and reduces or prevents vibration or yaw of the support platform.

As shown in FIG. 5, three mounting or flexure pads 90 are positioned on an upper surface of the sleeves 82 for mounting the support platform 33 thereon. The support platform assembly 32 further includes a central support 94 comprising two cross members 94a, 94b for preventing contact of the support platform 33 with the shield 72 during movement of the support platform.

It is to be understood that the sleeves 82 and shafts 70 may have configurations other than shown herein without departing from the scope of the invention. For example, although each of the shafts 70 is shown to have a circular cross-section, any other suitable cross-sectional shape such as ellipsoid or rectangular, may be used. The corresponding sleeves would also have similar corresponding cross-sectional shapes.

The support platform 33 is configured to support one or more articles such as a semiconductor wafer W or reticle for movement and positioning relative to the exposure system. The articles may be secured on the platform 33 by clamps, vacuum chuck, or any other suitable device. The dimensions of the stage may vary, depending on the specific application. Various devices such as an interferometer (not shown) may be utilized to measure and determine the orientation and position of the support platform 33. The interferometer utilizes signals reflected from mirrors positioned on faces 96a, 96b of the support platform 33 to measure and determine the orientation and position of the support platform (FIG. 6). The support platform 33 preferably includes an extension 98 which provides increased length of the mirrored face 96a for maintaining the mirrored face within sight of the interferometer to provide the reflected signals to the interferometer.

A feedback controller (not shown) may be provided to send different levels of current to the coil members 42, 46 in response to the orientation and position of the support platform 33. An interferometer or other suitable position sensor may send output signals indicative of the orientation and position of the support platform 33 to the feedback controller. The x direction linear motors 34 may be differentially driven to prevent and overcome any tendency of the support platform 33 to yaw, i.e., rotate about the z axis (FIG. 1). Such differential driving of the x direction linear motors 34 compensates for the tendency of the slide 30 to pivot, i.e., move faster on one side versus the other. This tendency of the slide 30 to pivot may be caused by the nonideal response of the linear motor 34 to the applied currents.

The stage positioning system 20 may comprise any suitable material such as steel, aluminum, ceramics, and plastics, for example. For electron beam lithography applications, all movable components are preferably formed from non-conducting, non-magnetic materials, such as ceramics or plastics.

Figure 7:
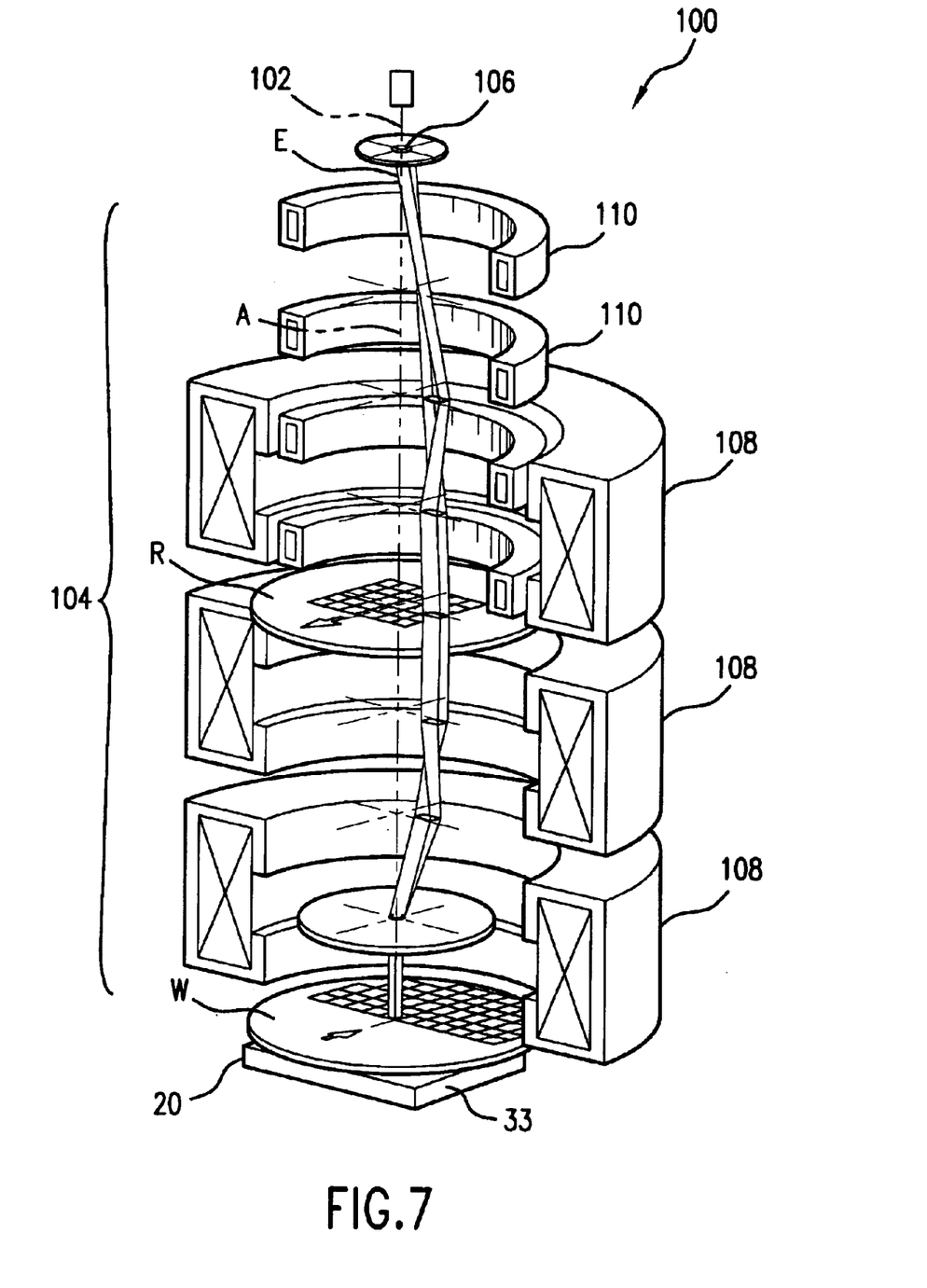
FIG. 7 is a perspective of a portion of an electron beam projection system with parts broken away to show detail.

FIG. 7 shows a portion of an electron beam lithography system 100 in which the stage positioning system 20 of the present invention may be utilized. The electron beam projection system includes an electron beam source 102, an electron beam column 104, and the stage movable in a number of degrees of freedom (e.g., three or six degrees of freedom) for positioning a workpiece such as a semiconductor wafer W relative to the electron beam column 104 to provide accurate alignment of the wafer with the optical systems for processing. The electron beam column 104 generally consists of a vertical arrangement of separate stages including a condenser lens, alignment stages, demagnification lens stages, a projection lens, a deflector system, and magnification lens stages, for example. The use of any one, or any one or more in combination,+ of these separate stages is defined as an optical projection system. The optical projection system is used to project a pattern defined by a mask onto a surface of the article. The electron beam system 100 operates under vacuum conditions to prevent gas molecules from perturbing the electron beam.

The electron beam source (gun) 102 emits a diverging beam E of electrons downwardly in the z direction along axis A through an illuminating aperture 106. After passing through the aperture 106, the beam E is collimated (rendered parallel) by a conventional magnetic lens acting as a condenser. The electron beam E may be gaussian in profile, or it may have a simple geometric shape such as a rectangle or triangle, or as an element of a repetitive pattern to be printed on the wafer W, for example. The beam E may also pass through a patterned area that imparts the final wafer pattern on it. The electron beam column 104 includes magnetic or electrostatic lenses 108 operable to focus the beam E onto a surface of the wafer W and deflectors 110 for directing the beam to specific positions on the wafer where photoresist placed on an upper surface of the wafer is to be exposed.

As shown schematically in the electron beam projection system of FIG. 7, the lens assemblies are aligned along the central longitudinal axis A of the electron beam column 104. For clarity, parts of the system are removed to show detail. A reticle (mask) R having a circuit pattern formed therein is placed between the lens assembles 108. The reticle R represents a pattern on a layer of an integrated circuit. The electron beam E will step in sequence through portions of the reticle R, the totality of which represents the pattern of the integrated circuit. As the beam E passes through the reticle R, the beam is patterned with the information contained in the reticle.

Figure 8:
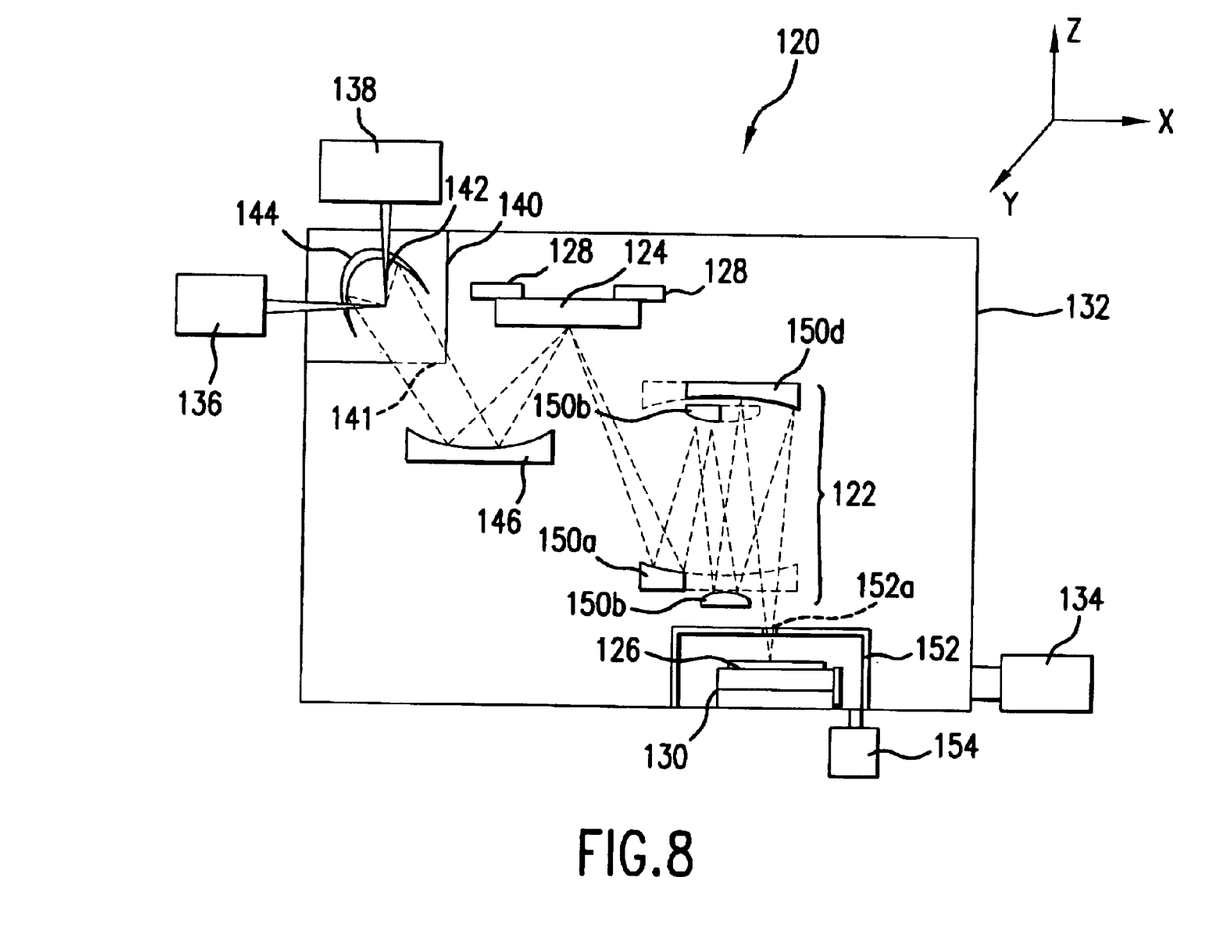
FIG. 8 is a representation of an EUV light lithography system using the positioning system of the invention.

A representative embodiment of an EUV light lithography system 120 according to the invention is depicted schematically in FIG. 8. The depicted embodiment is a projection-exposure apparatus employing light in the UV range as the exposure-illumination light. The EUV light will have a wavelength between 0.1 and 400 nm preferably between 1 and 50 nm. Projection-imaging is performed using an imaging-optical system 122, which forms a "reduced" (demagnified) image of the pattern defined by the mask 124 on the wafer 126. In FIG. 8, the optical axis of the imaging-optical system 120 extends in the Z-direction, and the Y-direction is perpendicular to the plane of the page.

As noted above, the pattern to be transferred onto the wafer 126 is defined by the reflection-type mask 124, which is mounted on a mask stage 128. The wafer 126 is mounted on a wafer stage 130. Typically, exposure is performed in a step-and-scan manner, wherein the mask pattern is projected in successive portions ("shot regions") while synchronously moving the mask stage 128 and wafer stage 130 relative to each other as exposure progresses. Scanning of the mask 124 and wafer 126 typically is performed in a single dimension relative to the imaging-optical system 122. Upon exposing all the shot regions on the mask 124 onto respective regions of the wafer surface, exposure of the pattern onto a die of the wafer 126 is complete. Exposure can then progress stepwise to the next die on the wafer 126.

The EUV light used as the illumination light for exposure has low transmittance through the atmosphere. Hence, the optical path through which the EUV light passes desirably is enclosed in a vacuum chamber 132. The vacuum chamber 132 is evacuated using a suitable vacuum pump 134. The EUV light desirably is produced by a laser-plasma X-ray source comprising a xenon target gas. The laser-plasma X-ray source (comprises a laser source 136 (serving as an excitation-light source) and a xenon gas supply 138. The laser-plasma X-ray source is enclosed by a vacuum chamber 140. The EUV light produced by the laser-plasma X-ray source passes through a window 141 in the vacuum chamber 140. Window 141 may also be formed as an aperture that permits the laser plasma X-ray source to pass unhindered. It is preferred that the vacuum chamber 140 is separate from the vacuum chamber 132 because debris tends to be generated by a nozzle 142 that discharges the xenon gas.

The laser source 136 is configured to generate laser light having a wavelength that can be within the range from infrared to ultraviolet. For example, a YAG laser or excimer laser can be used. The laser light from the laser source 136 is condensed and irradiated onto the stream of xenon gas (supplied from a gas supply 138) discharged from the nozzle 142. Irradiation of the stream of xenon gas causes heating of the xenon gas sufficiently to form a plasma. Photons of EUV light are emitted as the laser-excited molecules of xenon gas drop to a lower energy state.

A parabolic mirror 144 is situated in the vicinity of xenon-gas discharge. The parabolic mirror 144 collects and condenses the EUV light produced by the plasma. The parabolic mirror 144 constitutes herein the condenser optical system, and the parabolic mirror 144 is situated such that its focal point is nearly at the locus of discharge of the xenon gas from the nozzle 142. The parabolic mirror 144 comprises a multilayer film suitable for reflecting the EUV light. The multilayer film typically is provided on the concave surface of the parabolic mirror 144. The EUV light reflected from the multilayer film passes through the window 141 of the vacuum chamber 140 to a condenser mirror 146. The condenser mirror 146 condenses and reflects the EUV light to the reflection-type mask 124. To such end, the condenser mirror 146 also comprises a surficial multilayer film that is reflective to EUV light. EUV light reflected from the condenser mirror 146 illuminates the prescribed shot region on the reflection-type mask 124. As referred to herein, the parabolic mirror 144 and condenser mirror 146 collectively comprise the "illumination system" of the FIG. 8 apparatus.

The reflection-type mask 124 is configured with a multilayer EUV-reflective surface as described above, as further description of the mask 124 is omitted here. As the EUV light reflects from the mask 124, the EUV light becomes "patterned" with pattern data from the mask 124. The patterned EUV light passes through the projection system 122 to the wafer 126.

In one embodiment, the imaging-optical system 122 comprises four reflection mirrors: a concave first mirror 150a, a convex second mirror 150b, a convex third mirror 150c, and a concave fourth mirror 50d. Each of the mirrors 150a–150d comprises a multilayer film (reflective to EUV light) applied to a backing material (article). The mirrors 150a–15b in this embodiment are arranged so that their respective optical axes are coaxial with each other.

To prevent obstructing the optical path defined by the respective mirrors 150a–150d, appropriate cutouts are provided in the first mirror 150a, the second mirror 150b, and the fourth mirror 150d. (In FIG. 8, the dashed-line portions of the mirrors indicate the respective cutouts.) An aperture stop (not shown) is provided at the position of the third mirror 150c.

The EUV light reflected by the reflection-type mask 18 is reflected sequentially by the first mirror 150a through the fourth mirror 150d to form a reduced image of the mask pattern, based on a prescribed demagnification ratio β (for example β-¼, ⅕, or ⅙) within the respective shot region on the wafer 126. The projection system 122 is configured so as to be telecentric on its image side (wafer side).

The reflection-type mask 124 is supported, at least in the X-Y plane, by the movable reticle stage 128. The wafer 126 is supported, desirably in each of the X-, Y-, and Z-directions by the movable wafer stage 130. During exposure of a die on the wafer 126, while EUV light is irradiated to each shot region on the mask 124 by the illumination system, the mask 124 and wafer 126 are moved in a coordinated manner relative to the imaging-optical system 122 at a prescribed velocity according to the demagnification ratio of the imaging-optical system 122. Thus, the mask pattern is scanned progressively and exposed within a prescribed shot range (for a die) on the wafer 126.

During exposure, to prevent gases generated from the resist on the wafer 126 from depositing on and adversely affecting the mirrors 150a–150d of the imaging-optical system 122, the wafer 126 desirably is situated behind a partition 152. The partition 152 defines an aperture: 152a through which the EUV light can pass from the mirror 150d to the wafer 126. The space defined by the partition 152 is evacuated by a separate vacuum pump 154. Thus, gaseous contaminants produced by irradiation of the resist are prevented from depositing on the mirrors 150a–150d or on the mask 126, thereby preventing deterioration of optical performance of these components.

It will be observed from the foregoing that the stage positioning system 20 of the present invention has numerous advantages. Importantly, the system 20 provides movement of the support platform 33 in a scanning direction without movement of the magnet tracks 40, 44. Because the magnet tracks 40, 44 are stationary during exposure of the article, magnetic field shifts are minimized. Also, vibrations that may result from the movement of the slide in the first direction are eliminated. Moreover, the magnet tracks 40, 44 are substantially shielded to prevent interference of the magnetic fields with the electron beam. As a result, the stage positioning system 20 provides an accurate and reliable method for aligning articles such as semiconductor wafers or reticles in electron beam or EUV light lithography systems.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A stage positioning system comprising:

a stationary frame configured to support an article to be processed;

a slide movable relative to the stationary frame in a first direction;

a support platform connected to the slide and movable therewith in the first direction, the support platform being movably attached to the slide for movement in a second direction;

a first linear motor comprising a first magnet assembly and a first coil device engaged with the first magnet assembly to move the slide in the first direction; and a second linear motor comprising a second magnet assembly and a second coil device attached to the support platform and engaged with the second magnet assembly to move the support platform in the second direction, wherein elements of the stage positioning system having magnetic permeability remain essentially stationary during processing of the article.

2. The stage positioning system of claim 1 wherein the first magnet assembly is attached to the frame and comprises two generally parallel magnet tracks spaced in the second direction a distance generally equal to a length of the slide.

3. The stage positioning system of claim 2 wherein the first coil device comprises at least two coil members.

4. The stage positioning system of claim 1 wherein the second magnet assembly comprises a magnet track extending along an axis of the slide and the second coil device comprises at least one coil member.

5. The stage positioning system of claim 1 wherein the first and second magnet assemblies each include a magnet shield.

6. The stage positioning system of claim 1 wherein the slide comprises a pair of shafts extending generally parallel to a central longitudinal axis of the slide and wherein the support platform includes a pair of sleeves movably mounted on the shafts.

7. The stage positioning system of claim 6 wherein the pair of sleeves contain gas bearings to support the pair of sleeves about the pair of shafts.

8. The stage positioning system of claim 1 wherein the frame includes a rail and the slide and a slider block movably engagable with the rail.

9. The stage positioning system of claim 8 wherein the slider block contains bearings selected from rotating roller bearings, needle bearings, ball bearings, or gas bearings.

10. The stage positioning system of claim 7 wherein the frame includes a rail and slide; a slider block movably engagable with the rail; and the slider block further comprises bearing selected from rotating roller bearings, needle bearings, ball bearings, or gas bearings.

11. An electron beam lithography system for imaging a pattern onto an article, the system comprising:

an electron beam source for generating an electron beam;

an optical projection system to project a patter defined by a mask onto a surface of the article; and a stage positioning system for supporting and positioning the article; the system comprising:

a stationary frame configured to support an article to be processed;

a slide movable relative to the stationary frame in a first direction;

a support platform connected to the slide and movable therewith in the first direction, the support platform being movably attached to the slide for movement in a second direction;

a first linear motor comprising a first magnet assembly and a first coil device engaged with the first magnet assembly to move the slide in the first direction; and a second linear motor comprising a second magnet assembly and a second coil device attached to the support platform and engaged with the second magnet assembly to move the support platform in the second direction, wherein elements of the stage positioning system having magnetic permeability remain essentially stationary during processing of the article.

12. The electron beam lithography system of claim 11 wherein the first magnet assembly is attached to the frame and comprises two generally parallel magnet tracks spaced in the second direction a distance generally equal to a length of the slide.

13. The electron beam lithography system of claim 12 wherein the first coil device comprises at least two coil members.

14. The electron beam lithography system of claim 11 wherein the second magnet assembly comprises a magnet track extending along an axis of the slide and the second coil device comprises at least one coil member.

15. The electron beam lithography system of claim 11 wherein the first and second magnet assemblies each include a magnet shield.

16. The electron beam lithography system of claim 11 wherein the slide comprises a pair of shafts extending generally parallel to a central longitudinal axis of the slide and wherein the support platform includes a pair of sleeves movably mounted on the shafts.

17. The electron beam lithography system of claim 16 wherein the pair of sleeves contain gas bearings to support the pair of sleeves about the pair of shafts.

18. The electron beam lithography system of claim 17 wherein the frame further comprising at least one rail extending generally perpendicular to a central longitudinal axis of the slide.

19. The electron beam lithography system of claim 18 wherein the rail further comprises rotating roller bearings, needle bearings, air bearings, or ball bearings.

20. The electron beam lithography system of claim 11 wherein the article is exposed to the generated electron beam as the support platform moves in the second direction.

21. The electron beam lithography system of claim 11 wherein the article is not exposed to the generated electron beam as the slide moves in the first direction.

22. An EUV light lithography system for projection of a pattern onto an article, the system comprising:

an EUV light source for generating EUV light;

an optical projection system to project a pattern defined by a mask onto a surface of the article; and a stage positioning system for supporting and positioning the article; the system comprising:

a stationary frame;

a slide movable relative to the frame in a first direction;

a support platform connected to the slide and movable therewith in the first direction, the support platform being movably attached to the slide for movement in a second direction;

a first linear motor comprising a first stationary magnet assembly fixed to the stationary frame and a first coil device engaged with the first magnet assembly to move with the slide in the first direction; and a second linear motor comprising a second magnet assembly fixed to the slide and a second coil device attached to the support platform and engaged with the second magnet assembly to move with the support platform in the second direction;

wherein the first and second magnet assemblies remain essentially stationary during movement in the second direction.

23. The EUV light lithography system of claim 22 wherein the first magnet assembly comprises two generally parallel magnet tracks spaced in the second direction a distance generally equal to a length of the slide.

24. The EUV light lithography system of claim 22 wherein the second magnet assembly comprises a magnet track extending along an axis of the slide and the second coil device comprises at least one coil member.

25. The EUV light lithography system of claim 22, further including a shield adapted to shield the magnetic fields generated by the first and second magnet assemblies and wherein elements of the stage positioning system having magnetic permeability remain essentially stationary during processing of the article.

26. The EUV light lithography system of claim 25, wherein the first coil device comprises at least two coil members.

27. The EUV light lithography system of claim 25 wherein the slide comprises a pair of shafts extending generally parallel to a central longitudinal axis of the slide, and wherein the support platform includes a pair of sleeves movably mounted on the shafts.

28. The EUV light lithography system of claim 27 wherein a pair of gas bearings support the pair of sleeves about the pair of shafts.

29. The EUV light lithography system of claim 25 wherein the article is exposed to the generated electron beam as the support platform moves in the second direction.

30. The EUV light lithography system of claim 25 wherein the article is not exposed to the generated electron beam as the slide moves in the first direction.

31. A method of exposing an article in a lithography system, the method comprising:

providing a slide movably attached to a stationary frame such that the article can be positioned in a first direction;

providing a support platform movably attached to the slide such that the article disposed on the support platform can be positioned in a second direction;

providing a first linear motor to move the slide in the first direction, and providing a second linear motor to move the support platform in a second direction;

positioning the support platform by moving the slide to a selected position in the first direction; and exposing the article to light or an electron beam while maintaining magnet assemblies of the first and second linear motors stationary during the positioning of the support platform.

32. The method of claim 31 further comprising repeating the positioning of the support platform by moving the slide to a plurality of selected positions in the first direction, and exposing the article to light or an electron beam as the support platform is moved in the second direction after each successive position of the slide in the first direction.

33. The method of claim 31 wherein the first linear motor comprises a first magnet assembly that is attached to the frame and comprises two generally parallel magnet tracks spaced in the second direction a distance generally equal to a length of the slide.

34. The method of claim 31 wherein the second linear motor comprises a second magnet assembly that is attached to the slide and comprises a magnet track extending along an axis of the slide, and a second coil device comprising at least one coil member.

35. The method of claim 31 wherein movement of the support platform along the slide in the second direction is facilitated by a pair of sleeves connected to the support platform and movable along a pair of shafts of the slide that extend generally parallel to a central longitudinal axis of the slid.

36. The method of claim 35 wherein movement of the pair of sleeves along the pair of shafts of the slide is facilitated by gas bearings that support the pair of sleeves about the pair of shafts.

37. The method of claim 36 wherein movement of the support platform and slide in the first direction is facilitated by a slider block operably connected to the slide and platform and moveably engaging a rail of the frame; wherein the slider block comprises bearings selected from rotating roller bearings, needle bearings, ball bearings, or gas bearings.

* * * * *